US 9,592,665 B1

(12) United States Patent
Vasic et al.

(10) Patent No.: US 9,592,665 B1
(45) Date of Patent: Mar. 14, 2017

(54) MULTIPLEXED MULTILEVEL CONVERTER AMPLIFIER

(71) Applicant: Apex Microtechnology, Inc., Tucson, AZ (US)

(72) Inventors: Miroslav Vasic, Madrid (ES); Oscar Garcia, Madrid (ES); Pedro Alou, Madrid (ES); Jesus Oliver, Madrid (ES); José A. Cobos, Madrid (ES); Eric J. Boere, Nieuw-Vennep (NL)

(73) Assignee: APEX MICROTECHNOLOGY, INC., Tucson, AZ (US)

( * ) Notice: Subject to any disclaimer, the term of this patent is extended or adjusted under 35 U.S.C. 154(b) by 0 days.

(21) Appl. No.: 14/990,729

(22) Filed: Jan. 7, 2016

(51) Int. Cl.
*B41J 2/045* (2006.01)
*H03H 19/00* (2006.01)

(52) U.S. Cl.
CPC ....... *B41J 2/04546* (2013.01); *B41J 2/04586* (2013.01); *H03H 19/004* (2013.01); *H03M 2201/17* (2013.01)

(58) Field of Classification Search
CPC .............. B41J 2/04546; B41J 2/04586; H03M 2201/4204; H03M 2201/17; H03M 2201/8132; H03F 3/72; H03H 19/004
See application file for complete search history.

(56) References Cited

U.S. PATENT DOCUMENTS

| | | | |
|---|---|---|---|
| 6,400,192 B2 * | 6/2002 | Boezen | G11B 5/02 327/110 |
| 6,759,880 B2 * | 7/2004 | Koch, II | H03K 17/08122 326/83 |
| 7,880,515 B2 | 2/2011 | Kitazawa et al. | |
| 8,575,975 B1 | 11/2013 | Bhattacharya et al. | |
| 2003/0146791 A1 | 8/2003 | Shvarts et al. | |

OTHER PUBLICATIONS

Diaz et al., "Three-Level Cell Topology for a Multilevel Power Supply to Achieve High Efficiency Envelope Amplifier," IEEE Transactions on Circuits and Systems I: Regular Papers, vol. 59, No. 9 (Sep. 2012) (14 pages).

(Continued)

*Primary Examiner* — Thinh H Nguyen
(74) *Attorney, Agent, or Firm* — Ballard Spahr LLP

(57) ABSTRACT

A multiplexed multilevel converter amplifier. The converter is configured to generate a converter voltage. The converter voltage varies among a plurality of voltage levels. A multiplexer is comprised of at least four switches configured to generate a positive output voltage and a negative output voltage according to a configuration of the at least four switches. The positive output voltage varies between the converter voltage and a positive supply rail and the negative output voltage varies between the converter voltage and a negative supply rail. An amplifier is supplied by the multiplexer, and the amplifier generates an output voltage that varies between the positive output voltage and the negative output voltage. A control module is configured to control the configuration of the at least four switches of the multiplexer and the plurality of voltage levels of the converter voltage, such that the converter voltage is synchronized with the output voltage.

18 Claims, 7 Drawing Sheets

(56) References Cited

OTHER PUBLICATIONS

Kahn, L.R., "Single-Sideband Transmission by Envelope Elimination and Restoration," Proceedings of the IRE, vol. 40, No. 7, pp. 803-806, Jul. 1952.
Vasic et al., "Theoretical Efficiency Limits of a Serial and Parallel Linear-Assisted Switching Converter as an Envelope Amplifier," IEEE Transactions on Power Electronics, vol. 29, No. 2 (2014) (10 pages).
Vasic et al., "Multilevel Power Supply for High Efficiency RF Amplifiers,"( 2009) IEEE (6 pages).
Vasic, "Wide Bandwidth High Efficiency Power Converter for RF Amplifiers: Thesis Doctoral" Universidad Politecnica de Madrid (2010), available at http://oa.upm.es/4026/1/MIROSLAV_VASIC.pdf (231 pages).

\* cited by examiner

| Output voltage | SW$_A$ | SW$_B$ | SW$_C$ | SW$_D$ |
|---|---|---|---|---|
| Rising and V$_{out}$ < V$_{multilevel\_max}$ | Off | On | Off | On |
| Rising and V$_{out}$ > V$_{multilevel\_max}$ | On | Off | Off | On |
| Falling and V$_{out}$ > V$_{multilevel\_min}$ | On | Off | On | Off |
| Falling and V$_{out}$ < V$_{multilevel\_min}$ | On | Off | Off | On |
| Constant after charging | On | Off | On | Off |
| Constant after discharging | Off | On | Off | On |

MULTIPLEXED MULTILEVEL CONVERTER AMPLIFIER

FIELD

The present disclosure relates generally to power amplification, and more particularly to a variable output power supply to drive a capacitive load such as that of an ink jet printer head with a trapezoidal or similar voltage waveform.

BACKGROUND

The modern inkjet printer is able to place millions of tiny ink droplets precisely on paper, fabric, ceramic and other materials to create an image. Inkjet printing has many applications, a few of which include: food, beverage, and medical packaging and large format applications such as billboards and banners. Power operational amplifiers fulfill an important role in the design and powering of inkjet printers.

Piezoelectric techniques directed to inkjet printing typically employ a crystal that flexes when a voltage pulse is applied to a piezo-transducer, thereby forcing a droplet of ink out of the nozzle. When a voltage pulse is applied to piezoelectric material, it deforms, forcing a tiny droplet onto a surface that is to be printed. When the voltage returns to zero, the material is restored to its original shape, drawing ink into the reservoir and thus preparing it for the application of the next drop. This cycle repeats many times per second, typically each time the print head makes a pass across the printing area.

A representative printing head configuration may employ an amplifier to drive many nozzles. The amplifier may be connected to any number of ports of the nozzles at any one instant. At any instant, the printer head carrying all the nozzles is emitting anywhere from, more or less, 0 to 1024 ink droplets as governed by the printing program instructions. For inkjet printer applications, a trapezoidal waveform profile, among others, causes ink to flow from the ink magazine to the nozzle chamber to supply ink for the next droplet to be dispensed.

Amplifiers are employed in a wide variety of settings in modern electronics, only one of which is for use in driving the printer head of an inkjet printer. It is desirable for the design of a power amplifier to be compatible with any arbitrary wave shape that may be desired for a given application or printing solution. One power amplifier that can reproduce a trapezoidal waveform is a linear power amplifier, typically in a Class B or AB configuration. FIG. 1 shows a simplified block diagram of a basic linear power amplifier with its power sources and a capacitive load. FIG. 2 shows a simplified and exemplary output stage of a Class B power amplifier.

A potential drawback with the basic linear power amplifier approach, however, is relatively high power losses. FIG. 3 shows various aspects of waveforms involved with driving a capacitive load in accordance with the configuration of the Class B amplifier shown in FIG. 2. Generally, where a trapezoidal signal of frequency f with maximal voltage of $V_{max}$ and a piezoelectric load that can be modeled as a capacitor C, the power losses can be modeled as approximately:

$$P_{losses} = CfV_{positive\_constant}V_{max}$$

In the above equation, $V_{positive\_constant}$ is the positive voltage supply ($V_{positive}$ in FIG. 2) of the linear power amplifier. For ease of calculation, it can be assumed that the negative supply $V_{negative\_constant}$ is zero, i.e. the load is discharged via T2 in FIG. 2 to the ground. The power losses during the rising edge 307 of "Output Voltage" 301 shown in FIG. 3 are generally due to the voltage drop on transistor T1 201 shown in FIG. 2, while the power losses during the falling edge 308 are generally due to the voltage drop on transistor T2 202 and generally due to the fact that the capacitor is discharged to the ground or to a certain negative voltage.

SUMMARY

In some aspects of the present disclosure, a converter is configured to generate a converter voltage. The converter voltage varies among a plurality of voltage levels. A multiplexer is comprised of at least four switches configured to generate a positive output voltage and a negative output voltage according to a configuration of the at least four switches. The positive output voltage varies between the converter voltage and a positive supply rail and the negative output voltage varies between the converter voltage and a negative supply rail. An amplifier is supplied by the multiplexer, and the amplifier generates an output voltage that varies between the positive output voltage and the negative output voltage. A control module is configured to control the configuration of the at least four switches of the multiplexer and the plurality of voltage levels of the converter voltage, such that the converter voltage is synchronized with the output voltage.

In other aspects of the present disclosure, a method comprises generating a converter voltage using a converter, the converter voltage varying among a plurality of voltage levels. The method further comprises multiplexing a positive output voltage and a negative output voltage according to a configuration of at least four switches, the positive output voltage varying between the converter voltage and a positive supply rail and the negative output voltage varying between the converter voltage and a negative supply rail. The method further comprises supplying an amplifier by the multiplexer, the amplifier generating an output voltage that varies between the positive output voltage and the negative output voltage. The method further comprises synchronizing the converter voltage with the output voltage by controlling the configuration of the at least four switches of the multiplexer and the plurality of voltage levels of the converter voltage.

In some aspects, the converter is comprised of two-level stacked voltage cells. In other aspects, the converter is comprised of three-level stacked voltage cells. In other aspects, the amplifier drives a capacitive load. In other aspects, the capacitive load comprises an inkjet printer head and the output voltage comprises a trapezoidal waveform. In still other aspects, the control module further comprises trigger logic and at least one delay filter configured to synchronize the converter voltage with the output voltage, and the control module further comprises a D/A converter configured to convert a digital output reference to an analog input reference for the amplifier. In other aspects, during a rising ramp of the output voltage, the positive output voltage of the multiplexer varies according to a reference, and during a negative ramp of the output voltage the negative output voltage of the multiplexer is varied according to the reference.

BRIEF DESCRIPTION OF THE DRAWINGS

The following will be apparent from elements of the figures, which are provided for illustrative purposes and are not limiting and necessarily to scale or complete.

DETAILED DESCRIPTION

This description of the exemplary aspects of the disclosure is intended to be read in connection with the accompanying drawings, which are to be considered part of the entire written description.

Aspects of the present disclosure include methods and apparatuses to efficiently drive an amplifier with a load. In various aspects, a multiplexer multiplexes the output of a multi-level voltage converter between positive and negative supply rails to drive an amplifier, and a control module synchronizes the multi-level converter output with the output voltage of the amplifier. In other aspects, the amplifier provides an output of a trapezoidal voltage waveform to drive a capacitive load, such as an ink jet printer head.

Figure 4:
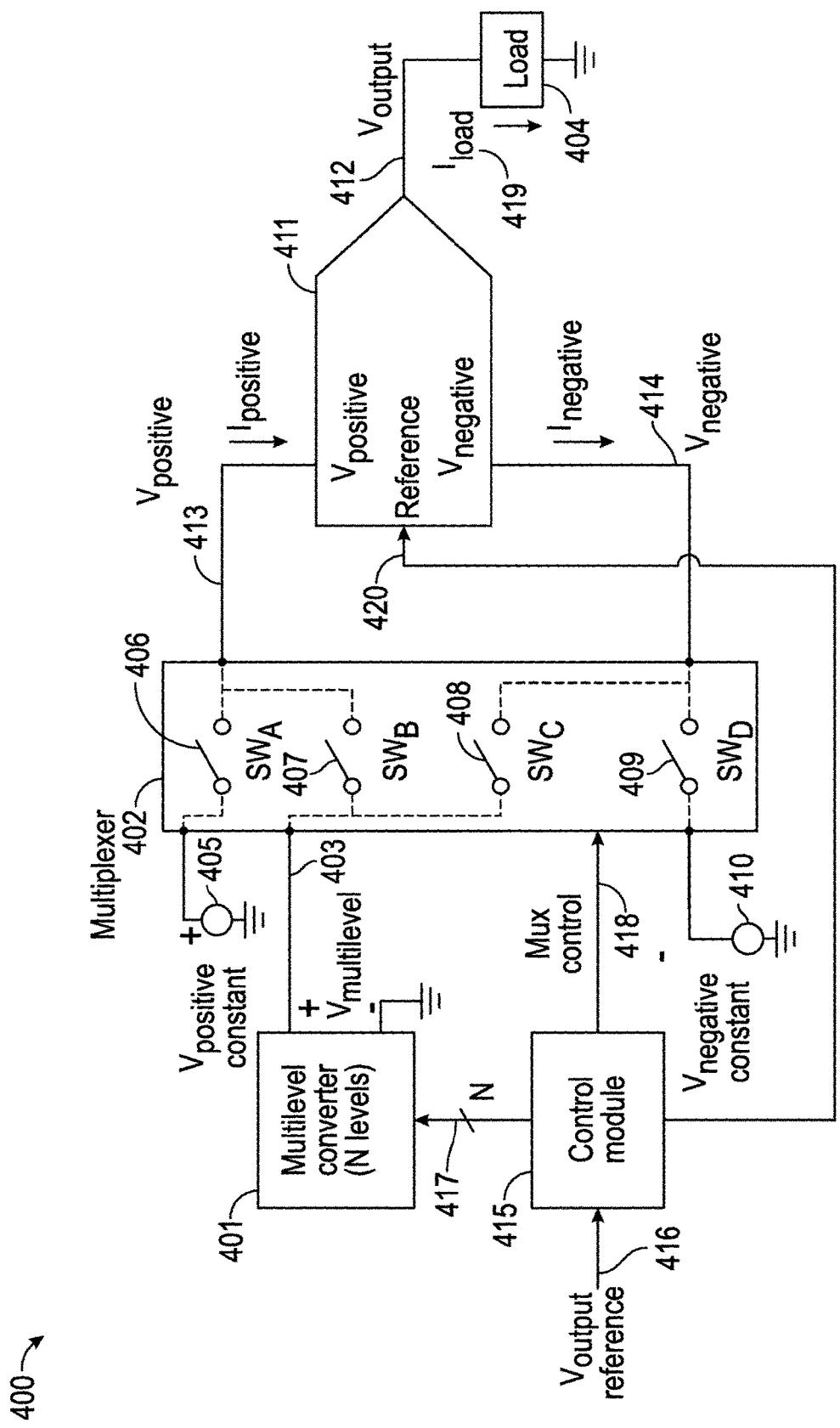
FIG. 4 shows a simplified schematic of a linear amplifier that drives a capacitive load supplied by a multilevel converter that is multiplexed in accordance with some aspects of the present disclosure.

FIG. 4 shows a simplified schematic of a power amplifier 400 that drives a capacitive load 404 supplied by a multi-level converter 401 by a multiplexer 402 in accordance with certain aspects of the present disclosure. In accordance with this aspect of the disclosure, a multilevel converter 401 generates N-levels of voltages ($V_{multilevel}$ 403) between ground and a maximum voltage that is less than $V_{constant\_positive}$ 405. The mulilevel converter 401 is coupled to the multiplexer 402, which may be implemented using four or more switches (for example, $SW_A$ 406, $SW_B$ 407, $SW_C$ 406, $SW_A$ 406). The switches 406-409 may be MOSFET transistors or any other switching device known in the art, such as bipolar transistors or insulated gate bipolar transistors (IGBTs).

The multiplexer 402 is coupled to a linear power amplifier 411 which provides output $V_{output}$ 412 for driving the load 404. When closed, Switch A ($SW_A$) 406 of the multiplexer 402 couples a constant positive supply rail, $V_{constant\_positive}$ 405 to the positive supply rail of the amplifier, $V_{positive}$ 413. When closed, Switch B ($SW_B$) 407 of the multiplexer 402 couples the multilevel converter output voltage, $V_{multilevel}$ 403, to the positive supply rail of the amplifier, $V_{positive}$ 413. When closed, Switch C ($SW_C$) 408 of the multiplexer 402 couples the multilevel converter output voltage, $V_{multilevel}$ 403, to the negative supply rail of the amplifier, $V_{negative}$ 414. When closed, Switch D ($SW_D$) 409 of the multiplexer 402 couples a constant negative supply rail, $V_{constant\_negative}$ 410 to the negative supply rail of the amplifier, $V_{negative}$ 414. A control module 415 is coupled to an output reference voltage, $V_{output\_ref}$ 416, for example a digitized form of $V_{output}$ 412 or any other signal that can be related to the voltage across the load 404. As will be described in further detail, the control module 415 generates control signals 417 for controlling the voltage output ($V_{multilevel}$ 401) of the multilevel converter 402 and control signals 418 for the configurations of the switches $SW_A$-$SW_D$ 406-409 of the multiplexer 402. Other switch configurations are contemplated by the disclosure to achieve similar results.

Figure 1:
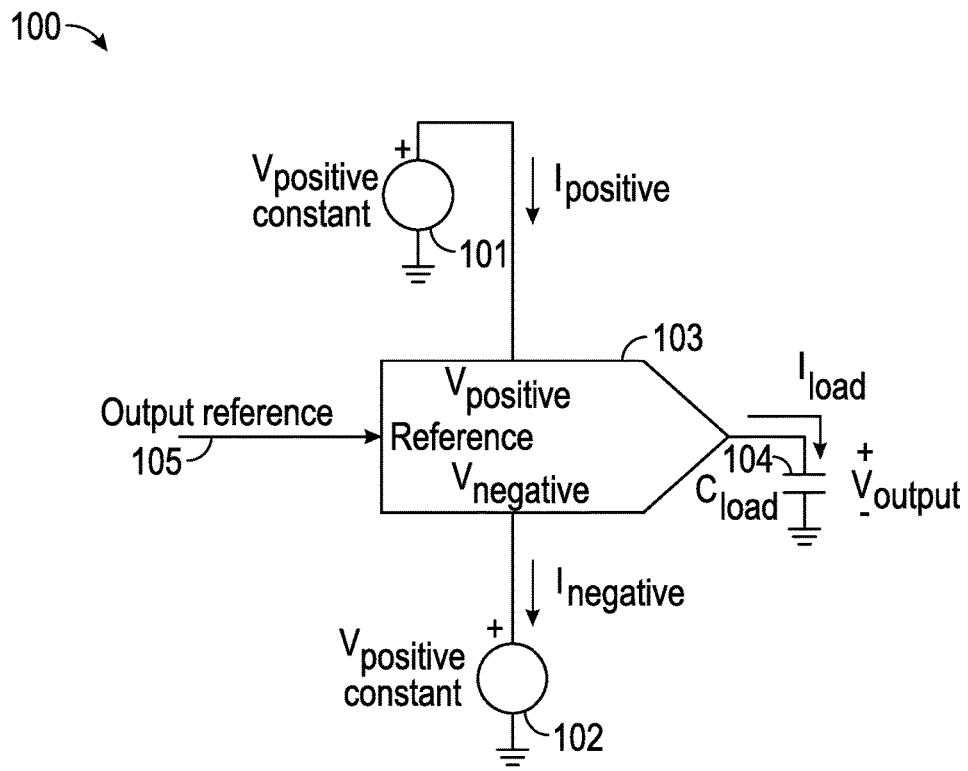
FIG. 1 is a simplified schematic of a linear power amplifier that is supplied by two constant voltage supplies ($V_{positive\_constant}$ and $V_{negative\_constant}$) that drives a capacitive load (PRIOR ART).
Figure 2:
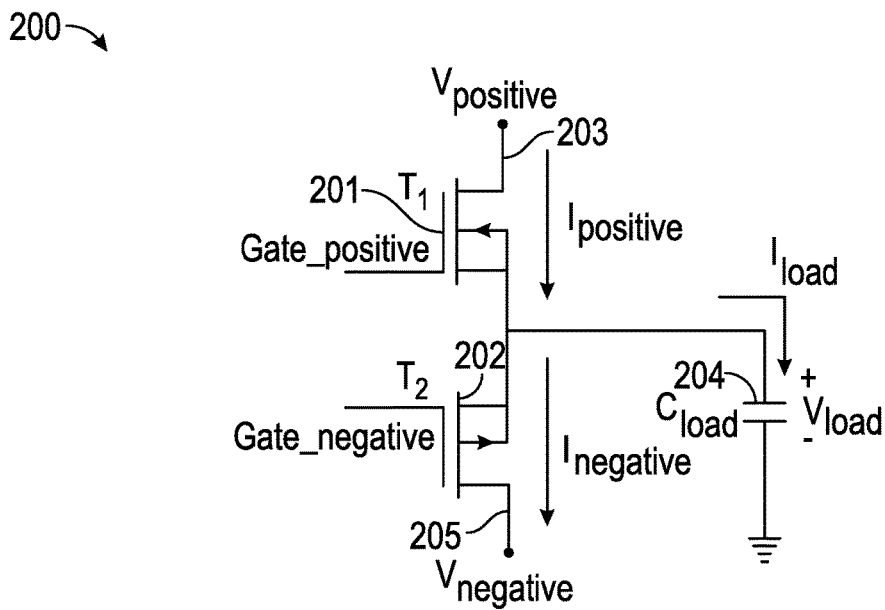
FIG. 2 is a simplified schematic of an output stage of a class B power amplifier driving a capacitive load (PRIOR ART).
Figure 3:
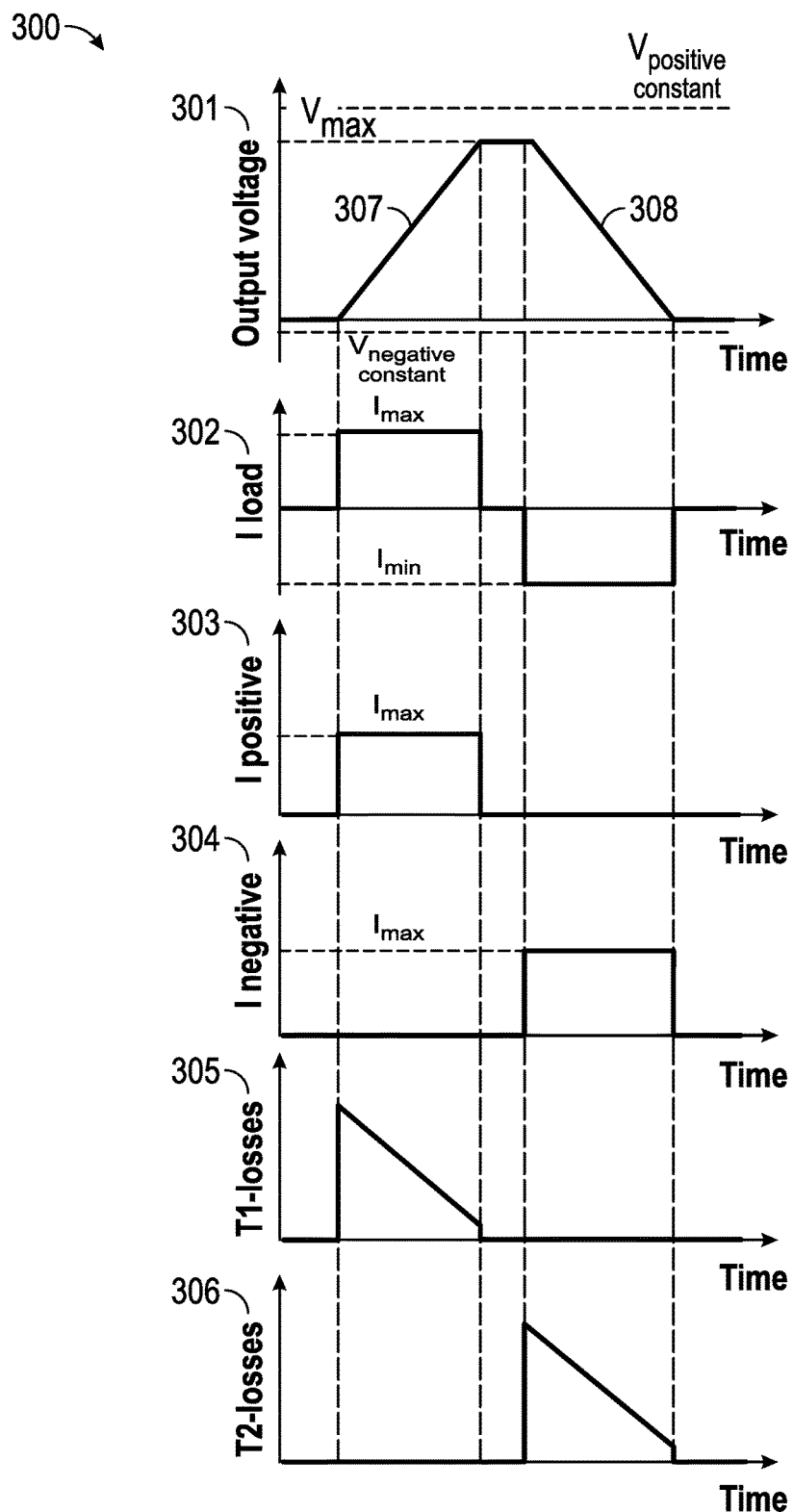
FIG. 3 shows waveforms for a capacitive load and trapezoidal output voltage when the linear amplifier according to FIG. 2 is supplied by constant voltages on both rails (PRIOR ART).
Figures 6, 7:
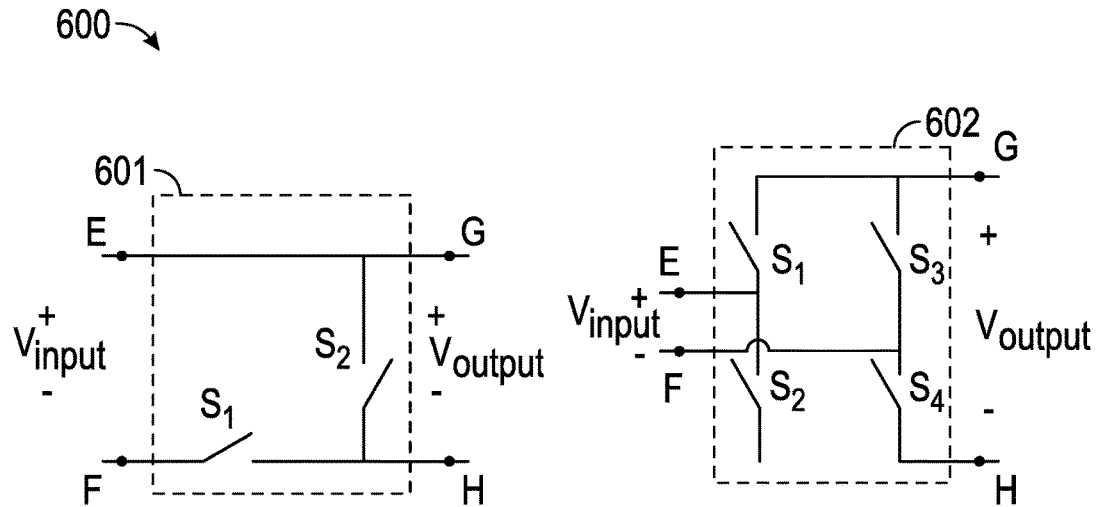
FIG. 6 shows exemplary two-level and three-level cells that can be used for the implementation of a multilevel converter in configurations in accordance with some aspects of the disclosure.
FIG. 7 is a table showing control signals for a multiplexer in accordance with aspects of the disclosure.
Figure 8:
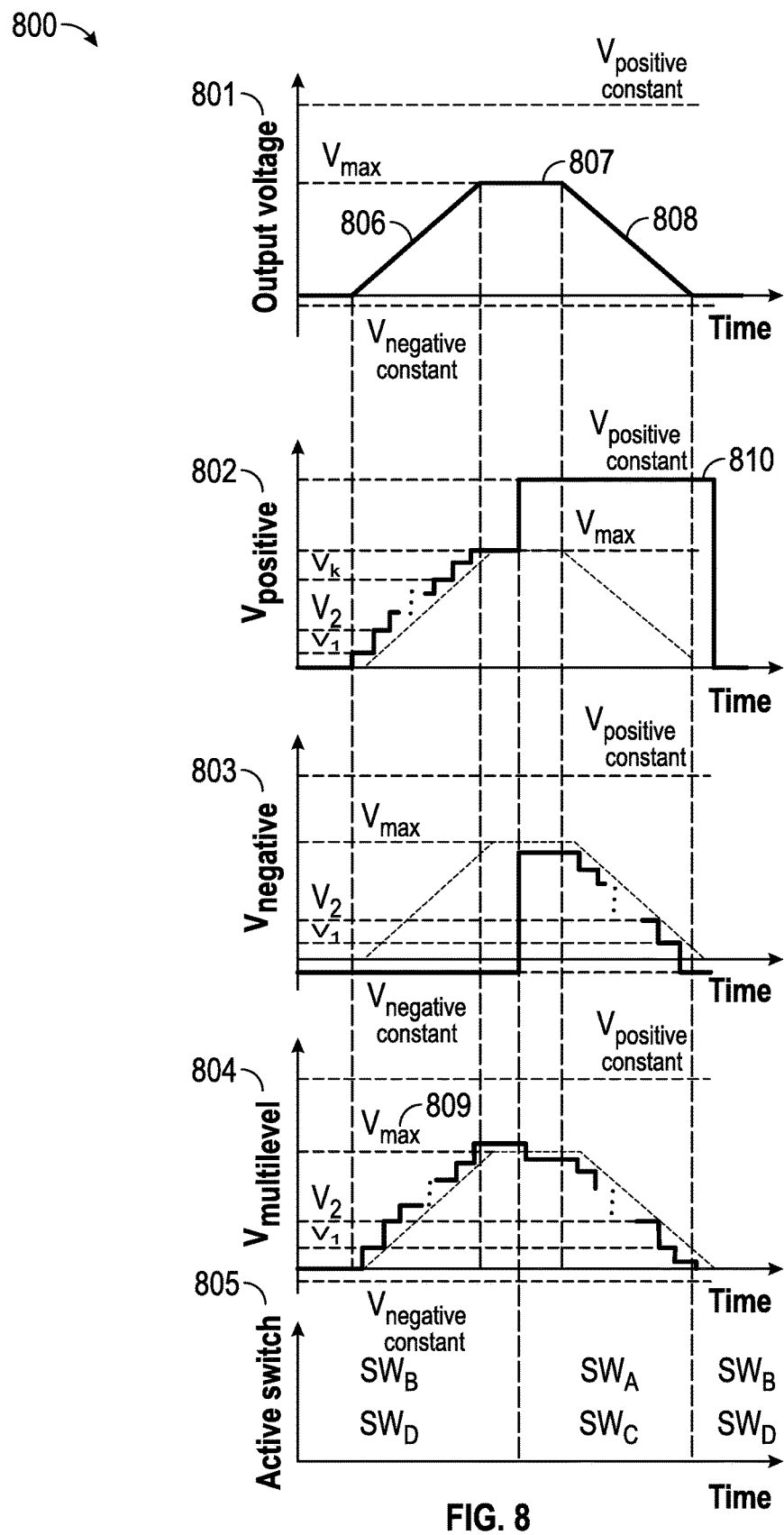
FIG. 8 shows exemplary time diagrams for waveforms in accordance with some aspects of the disclosure.

FIG. 8 shows waveforms 800 in accordance with aspects of the disclosure implemented in FIG. 4. According to this aspect, power amplifier 400 uses a single multiplexed multilevel converter 402 and switches 406-409 in operation according to the configurations shown in the table of FIG. 7. In this aspect of the disclosure, during the rising edge 806 of the output voltage 412, the multilevel converter 402 supplies the linear amplifier 411 while the output voltage 412 is lower than the maximal multilevel voltage 403 (switch $SW_A$ 406 is opened and $SW_B$ 407 closed). As the multilevel converter 401 should be connected only to one supply rail (413, 414) of the linear power amplifier 411 at a time, switch $SW_C$ 408 is opened while $SW_D$ 409 is closed. During the rising edge 806 of the output voltage 412, the load current 419 comes from the $V_{positive}$ supply rail 413. According to this aspect, the applied multilevel voltage 403 may reduce power losses in the pass transistor of the output power stage (transistor T1 201 in FIG. 2) because the voltage drop on this transistor is reduced as compared to when it is supplied by a constant voltage. During this rising edge 806, the pass transistor from the second supply rail (transistor T2 202 in FIG. 2), $V_{negative}$ 414, does not conduct any current (and hence presents minimal power losses) and its drain can be connected to a constant supply voltage, $V_{constant\_negative}$ 410, via the multiplexer 402.

In this embodiment, when the output voltage 412 reaches maximal multilevel output voltage, $V_{multilevel\_max}$ 809, the linear amplifier is supplied directly from the constant voltage supply, $V_{constant\_positive}$ 405, 801 (where $V_{constant\_positive} > V_{multilevel\_max}$), and the switch $SW_A$ 406 is closed, while $SW_B$ 407 is opened. To avoid clipping the output voltage $V_{constant\_positive}$ 405 is preferably higher than the maximal output voltage. Once the output voltage 412 has risen to a desired value, it will maintain a relatively constant voltage level 807 during the desired time (depending on the type of application, for example, on the type of ink, inkjet head, etc.). In this aspect, the energy taken from the multilevel converter 401 is approximately equal to the energy lost in the pass element (transistor T1 201) and the energy accumulated in the capacitive load 404. During the time when the output voltage 412 is relatively constant, there is no current required by the load and this time can be used to move the multilevel converter to the negative supply rail 414, switch $SW_C$ 408 is closed and $SW_D$ 409 is opened. Also in this aspect, when the multilevel converter 401 is connected to the negative supply rail 414, its output voltage 403 is preferably lower than the output voltage of the amplifier 412 so as to avoid a short-circuit through the parasitic diode of transistor T2 202 of the linear amplifier output stage 411.

In this embodiment, during the negative edge 808 of the output voltage 412, there is little if any current through transistor T1 201 and thus little to no power loss through the device. In this aspect, the capacitive load 404 is discharged through transistor T2 202, and when the multilevel converter 401 is applied on the drain of this transistor, power losses are reduced as compared with the case when a constant voltage source is applied. According to this aspect, when the output voltage 412 is lower than the minimal multilevel output 403, the negative rail 414 of the linear power amplifier 411 is supplied directly from a constant voltage supply ($V_{constant\_negative}$ 410), switch $SW_C$ 408 is opened, and $SW_D$ 409 is closed. In certain aspects of the disclosure, this configuration supplies a negative voltage so that the load voltage 412 can be discharged to zero. One aspect of the present disclosure is that, during the falling edge 808 of the output voltage 412, the energy accumulated in the capacitive load 404 may be partially lost as heat on transistor T2 202 and partially recuperated by the multilevel converter 401.

Figure 5:
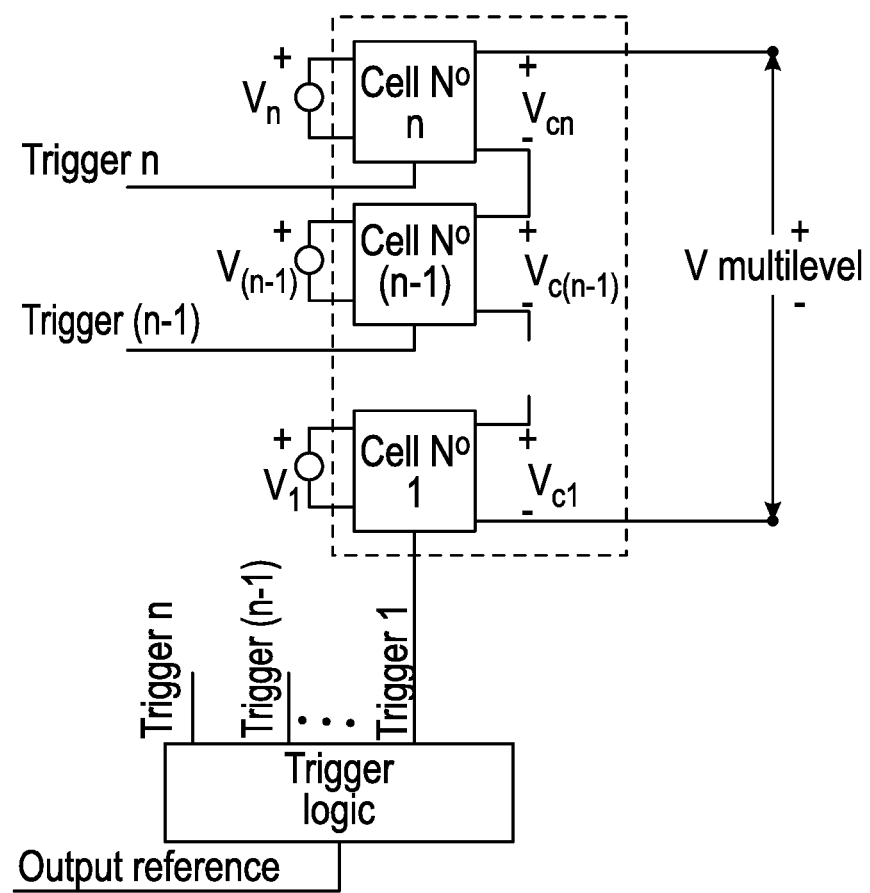
FIG. 5 shows a simplified schematic of a multilevel converter implemented with stacked voltage cells in configurations in accordance with some aspects of the disclosure.

In this embodiment, the multilevel converter 401 may be implemented using stacked voltage cells 500, for example those shown in FIG. 5. The voltage cells can include two-level cells 601 or three-level cells 602 in accordance with aspects of the disclosure shown in FIG. 6. The two-level cell 601 can reproduce the input voltage (S1 closed, S2 opened) and zero (S1 opened, S2 closed), while the thee level cell 602 can produce input voltage (S1, S4 closed, S2, S3 opened), zero (S1, S2 closed, S3, S4 opened or S1,S2 opened, S3, S4 closed) or negative input voltage (S2,S3 opened, S1, S4 opened). The switches in the cells can be implemented using MOSFETs or any other switching device, such as bipolar transistors or insulated gate bipolar transistors (IGBTs). It is desirable for the cells to be supplied by galvanically isolated voltage supplies. When there are N two-level cells 601 and M three-level cells 602, the total number of voltage levels that can be produced is (2M+1)+N. In that aspect of the disclosure, the number of transistors for the multilevel converter 401 is 4M+2N, while the number of the transistor drivers is 2M+N. Given this relationship, one of ordinary skill will appreciate the design trade-off that the more multilevel converters 401 included in the design, the higher the complexity because of the number of transistors and drivers and because of the power supply that will generate 2(M+N) mutually-isolated voltage sources.

The higher the number of voltage levels 403 of the converter 401, the lower are the power losses in the linear amplifier 411. For any given number of voltage levels, it is desirable to find an optimal distribution of voltage levels. This can be done using heuristic techniques or genetic algorithm approaches known in the art. By increasing the number of voltage levels 403, the overall efficiency generally first increases as the power losses in the linear amplifier part decreases. However, by increasing the number of levels 403, the driving losses of the multiplexer 402 generally increase as well. Additionally, the more voltage levels 403 that are used, the lower is the efficiency of the first stage. This means that, in one moment, the additional power losses that increase with the complexity of the system will be equilibrated with power savings. Any further increment in the number of voltage levels 403 may produce fewer benefits in terms of overall efficiency. This is the optimal number of voltage levels from the point of view of efficiency. However, from the point of view of complexity of the system it is necessary to analyze the increment of efficiency with each increment of the voltage levels. Each increment in the voltage levels means more components and, normally, less reliability. The decision on the optimal number of levels must be made by analyzing the complexity and the overall efficiency. This number depends on the type of load 404, voltage levels 403, frequency of the pulse etc. and will vary from case to case.

Figure 9:
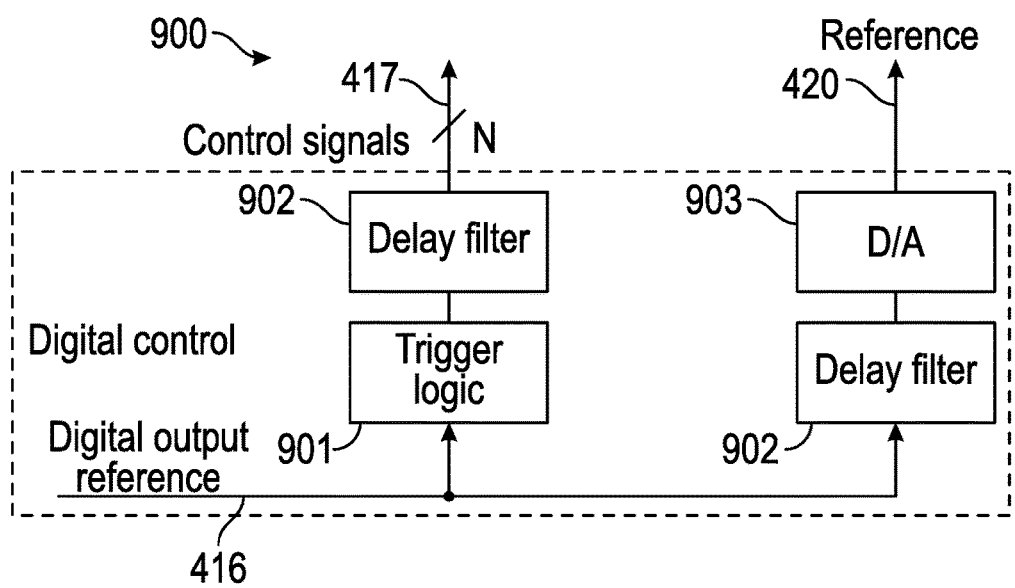
FIG. 9 shows a simplified schematic of various aspects of a control module, in accordance with some aspects of the present disclosure.

Moving to FIG. 9, in another embodiment, the control module 415 includes trigger logic 901, one or more D/A converters 903, and one or more delay filters 902. In this aspect, the trigger logic 901 compares the output signal reference 416 with threshold values in order to generate the control signals for the multilevel converter 417. A two-level cell configuration 601 of the multilevel converter 401 according to this aspect may be controlled by a single signal, while a three level cell configuration may be controlled by at least two control signals. The trigger logic 901 can be implemented as any type of logic circuit, such as an analog circuit with a set of comparators or as a piece of the control software in a digital signal processor (DSP) or field programmable gate area (FPGA). The output voltage reference 416 may be recorded in memory.

The control signals 417, 418 of the multilevel converter 401 and the multiplexer 402 should assure that, in any given time instant, the output voltage is lower than $V_{positive}$ 413 and higher than $V_{negative}$ 414, otherwise the output voltage may be clipped. The clipping of the output voltage 412 may occur due to the poor synchronization between the multilevel voltage 403 and output voltage 412 due, at least in part, to a finite time response of the multilevel converter 401 and, therefore, the analog reference 420 sent to the power amplifier 411 is preferably delayed. The delay block 902 can be implemented using any type of delay mechanism, such as an analog filter with linear phase delay or by delaying the reference digitally using a chain of registers. In other aspects of the disclosure, the delayed digital reference 416 is passed through a digital-to-analog (D/A) converter so that the linear amplifier 411 can amplify the analog reference 420. In some aspects, the path from the digital reference 416 to the analog reference 420 can contain more time delay than the path for the multilevel converter supply. In these aspects, the delay is preferably added to the voltage cell control signals 417, which can be implemented within the control block 900 digitally through various registers.

Although examples are illustrated and described herein, embodiments are nevertheless not limited to the details shown, since various modifications and structural changes may be made therein by those of ordinary skill within the scope and range of equivalents of the claims. For example, although an ideal switch has been disclosed as an example, it will be appreciated that this is not intended to mean that other devices could not be used instead. One skilled in the art would also appreciate that various components may be interplaced between the components shown in the figures without departing from the operation of the disclosure, such as the insertion of current-limiting resistors or other circuit components or modules between the switches and amplifier inputs. Additionally, the apparatus has been described in schematic form to enable it to be easily under stood by a person skilled in the art, though it will be appreciated that other components and devices may be utilized in the apparatus, if desired. Also, although the input voltage waveform has been described as a symmetrical trapezoid, it will be appreciated that various waveforms may be used, including whereby the slew rate may vary through the rise and fall rates.

What is claimed is:

1. An apparatus, comprising:
a converter configured to generate a converter voltage, the converter voltage varies among a plurality of voltage levels;
a multiplexer comprising at least four switches configured to generate a positive output voltage and a negative output voltage according to a configuration of the at least four switches, the positive output voltage varies between the converter voltage and a positive supply rail and the negative output voltage varies between the converter voltage and a negative supply rail;
an amplifier supplied by the multiplexer, the amplifier generates an output voltage that varies between the positive output voltage and the negative output voltage;
a control module configured to control the configuration of the at least four switches of the multiplexer and the plurality of voltage levels of the converter voltage, such that the converter voltage is synchronized with the output voltage.

2. The apparatus of claim 1, wherein the converter is comprised of two-level stacked voltage cells.

3. The apparatus of claim 1, wherein the converter is comprised of three-level stacked voltage cells.

4. The apparatus of claim 1, wherein the amplifier drives a capacitive load.

5. The apparatus of claim 4, wherein the capacitive load comprises an inkjet printer head.

6. The apparatus of claim 4 or claim 5, wherein the output voltage comprises a trapezoidal waveform.

7. The apparatus of claim 1, wherein the control module further comprises trigger logic and at least one delay filter configured to synchronize the converter voltage with the output voltage.

8. The apparatus of claim 7, wherein the control module further comprises a D/A converter configured to convert a digital output reference to an analog input reference for the amplifier.

9. The apparatus of claim 1, wherein during a rising ramp of the output voltage the positive output voltage of the multiplexer varies according to a reference, and during a negative ramp of the output voltage the negative output voltage of the multiplexer is varied according to the reference.

10. A method, comprising:
generating a converter voltage using a converter, the converter voltage varying among a plurality of voltage levels;
multiplexing a positive output voltage and a negative output voltage according to a configuration of at least four switches, the positive output voltage varying between the converter voltage and a positive supply rail and the negative output voltage varying between the converter voltage and a negative supply rail;
supplying an amplifier by the multiplexer, the amplifier generating an output voltage that varies between the positive output voltage and the negative output voltage; and
synchronizing the converter voltage with the output voltage by controlling the configuration of the at least four switches of the multiplexer and the plurality of voltage levels of the converter voltage.

11. The method of claim 10, wherein the converter is comprised of two-level stacked voltage cells.

12. The method of claim 10, wherein the converter is comprised of three-level stacked voltage cells.

13. The method of claim 10, wherein the amplifier drives a capacitive load.

14. The method of claim 13, wherein the capacitive load comprises an inkjet printer head.

15. The method of claim 13 or claim 14, wherein the output voltage comprises a trapezoidal waveform.

16. The method of claim 10, wherein the synchronizing step comprises configuring trigger logic and at least one delay filter to synchrone the converter voltage with the output voltage.

17. The method of claim 16, wherein the controlling step further comprises converting a digital output reference to an analog input reference for the amplifier.

18. The method of claim 10, wherein during a rising ramp of the output voltage the positive output voltage of the multiplexer varies according to a reference, and during a negative ramp of the output voltage the negative output voltage of the multiplexer is varied according to the reference.

* * * * *